(12) United States Patent
Akahane

(10) Patent No.: US 12,007,825 B2
(45) Date of Patent: Jun. 11, 2024

(54) SLAVE COMMUNICATION APPARATUS AND MASTER COMMUNICATION APPARATUS

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 388 days.

(21) Appl. No.: 17/455,219

(22) Filed: Nov. 17, 2021

(65) Prior Publication Data

US 2022/0075439 A1 Mar. 10, 2022

Related U.S. Application Data

(62) Division of application No. 16/455,805, filed on Jun. 28, 2019, now Pat. No. 11,188,137.

(30) Foreign Application Priority Data

Aug. 3, 2018 (JP) ................................. 2018-146387

(51) Int. Cl.
*H04L 7/00* (2006.01)
*G06F 1/04* (2006.01)
(Continued)

(52) U.S. Cl.
CPC .............. *G06F 1/3237* (2013.01); *G06F 1/04* (2013.01); *G06F 1/10* (2013.01); *G06F 1/12* (2013.01);
(Continued)

(58) Field of Classification Search
CPC . H04W 56/0015; H04W 74/04; H04W 88/08; H04W 4/80; H04W 88/02;
(Continued)

(56) References Cited

U.S. PATENT DOCUMENTS 5,600,634 A 2/1997 Satoh
9,001,850 B2* 4/2015 Berger .................. H01S 3/0941
372/6
(Continued)

FOREIGN PATENT DOCUMENTS

CN 201156726 Y 11/2008
JP H02276348 A 11/1990
(Continued)

OTHER PUBLICATIONS

U.S. Appl. No. 16/455,805, filed Jun. 28, 2019, to Masashi Akahane.
(Continued)

*Primary Examiner* — Eva Y Puente

(57) ABSTRACT

A slave communication apparatus including a clock recovering section that recovers a clock signal from a transmission signal having a first signal value when the clock is a first level, a second signal value when the clock is a second level and data has a first data value, and a third signal value between the first and second signal values when the clock is the second level and the data has a second data value; and a data recovering section that recovers the data, wherein the data recovering section sets the data threshold value to be a first setting value between the second and third signal values in response to the recovered data having the second data (Continued)

value, and sets the data threshold value to be a second setting value between the first and third signal values in response to the recovered data having the first data value.

4 Claims, 8 Drawing Sheets

(51) Int. Cl.
```
G06F 1/10      (2006.01)
G06F 1/12      (2006.01)
G06F 1/3237    (2019.01)
G06F 13/00     (2006.01)
G06F 13/40     (2006.01)
H04B 3/02      (2006.01)
B60R 16/03     (2006.01)
G11C 16/12     (2006.01)
G11C 29/56     (2006.01)
```
(52) U.S. Cl.
CPC .............. *G06F 13/00* (2013.01); *G06F 13/40* (2013.01); *H04L 7/00* (2013.01); *H04L 7/0008* (2013.01); *H04L 7/0012* (2013.01); *B60R 16/0315* (2013.01); *G11C 16/12* (2013.01); *G11C 29/56012* (2013.01); *H04B 3/02* (2013.01)

(58) Field of Classification Search
CPC ....... H04W 24/00; H04W 28/22; H04W 4/18; H04W 56/00; H04B 10/80; H04B 3/02; H04B 10/40; H04B 10/1123; H04B 1/16; H04B 10/801; H04B 7/04; H04L 7/0008; H04L 7/033; H04L 7/0331; H04L 25/14; H04L 7/0337; H04L 7/04; H04L 49/3081; H04L 1/205; H04L 12/12
USPC ........................................................ 375/345
See application file for complete search history.

(56) References Cited

U.S. PATENT DOCUMENTS

| | | | |
|---|---|---|---|
| 9,191,184 B2 | 11/2015 | Baek | |
| 10,200,186 B2 | 2/2019 | Akahane | |
| 10,281,941 B2 | 5/2019 | Mori | |
| 10,284,192 B2 | 5/2019 | Akahane | |
| 10,644,866 B2 | 5/2020 | Akahane | |
| 10,841,071 B2 | 11/2020 | Akahane | |
| 2002/0018458 A1* | 2/2002 | Aiello | H04W 56/0015 370/348 |
| 2002/0186159 A1* | 12/2002 | Reinhold | H04L 7/007 341/155 |
| 2005/0190739 A1* | 9/2005 | Sparrell | H04B 7/2659 370/347 |
| 2007/0112990 A1 | 5/2007 | Hayashita | |
| 2008/0170643 A1 | 7/2008 | Lee | |
| 2013/0094373 A1* | 4/2013 | Reidl | H04L 25/4902 370/252 |
| 2014/0036903 A1* | 2/2014 | Ryan | H04W 56/00 370/350 |
| 2014/0140431 A1 | 5/2014 | Lee | |
| 2015/0039801 A1 | 2/2015 | Mori | |
| 2020/0042073 A1 | 2/2020 | Akahane | |

FOREIGN PATENT DOCUMENTS

| | | |
|---|---|---|
| JP | H10107782 A | 4/1998 |
| JP | 2007164765 A | 6/2007 |
| WO | 2016203529 A1 | 12/2016 |

OTHER PUBLICATIONS

Office Action issued for counterpart Japanese Application No. 2018-146387, issued by the Japan Patent Office dated Jul. 5, 2022 (dated Jun. 29, 2022).

* cited by examiner

SLAVE COMMUNICATION APPARATUS AND MASTER COMMUNICATION APPARATUS

CROSS-REFERENCE TO RELATED APPLICATIONS

This application is a divisional of U.S. patent application Ser. No. 16/455,805, filed on Jun. 28, 2019, which claims priority to Japanese patent application No. 2018-146387 filed on Aug. 3, 2018, the contents of each of which are incorporated herein by reference in their entirety.

BACKGROUND

1. Technical Field

The present invention relates to a slave communication apparatus and a master communication apparatus.

2. Related Art

Patent Document 1 discloses a communication system that performs bidirectional communication between a master communication apparatus and a slave communication apparatus, via a single communication line. In Patent Document 1, the master communication apparatus transmits a transmission signal having data and a clock embedded therein to the slave communication apparatus via a communication line, and the slave communication apparatus recovers the clock and the data from the received transmission signal.

Patent Document 1: International Publication WO 2016/203529

The characteristics of the communication line between the master communication apparatus and the slave communication apparatus may differ according to the application of the communication system or the like. Therefore, the master communication apparatus and the slave communication apparatus are desirably able to be used with communication lines having a wide range of characteristics.

SUMMARY

To realize the above objective, according to a first aspect of the present invention, provided is a slave communication apparatus comprising a clock recovering section that recovers a clock signal from a transmission signal that has a first signal value when the clock is a first level, a second signal value when the clock is a second level and data has a first data value, and a third signal value between the first signal value and the second signal value when the clock is the second level and the data has a second data value; and a data recovering section that recovers the data according to a result of a comparison between the transmission signal and a data threshold value, wherein the data recovering section sets the data threshold value to be a first setting value that is between the second signal value and the third signal value in response to the recovered data having the second data value, and sets the data threshold value to be a second setting value that is between the first signal value and the third signal value in response to the recovered data having the first data value.

According to a second aspect of the present invention, provided is a master communication apparatus comprising a signal generating section that generates a transmission signal by embedding a clock in data, the transmission signal having a first signal value when the clock is a first level, a second signal value when the clock is a second level and the data has a first data value, and a third signal value between the first signal value and the second signal value when the clock is the second level and the data has a second data value; and a signal level switching section that switches signal levels of the second signal value and the third signal value according to a slave communication apparatus that is a destination of the data.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
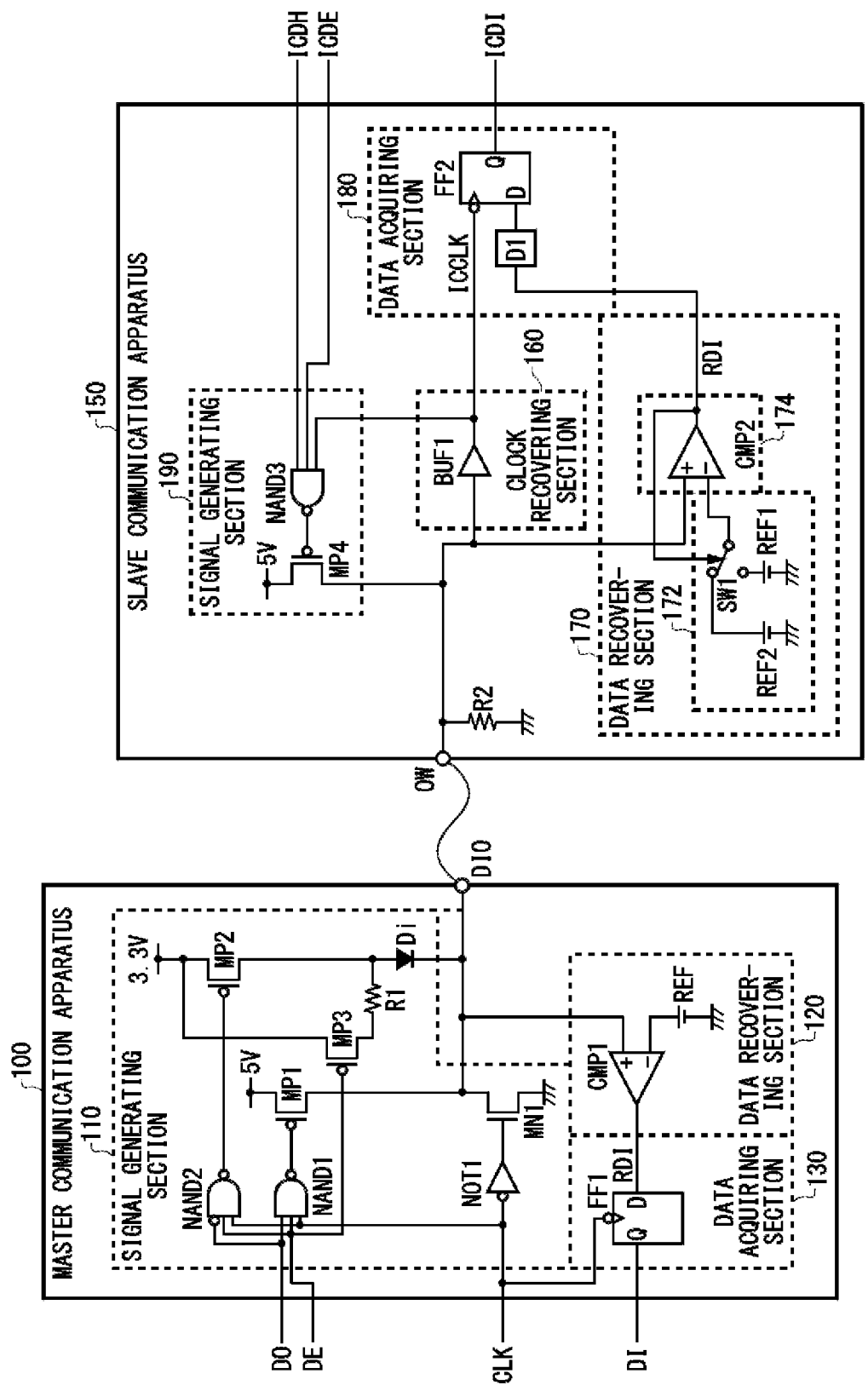
FIG. 1 shows the configuration of a communication system 10 according to the present embodiment.

FIG. 1 shows the configuration of a communication system 10 according to the present embodiment. The communication system 10 includes a master communication apparatus 100 and a slave communication apparatus 150 that are connected by a communication line, and transmits a transmission signal having a clock embedded in data between the master communication apparatus 100 and the slave communication apparatus 150 via the communication line. The master communication apparatus 100 is a communication apparatus that transmits the clock to the slave communication apparatus 150 via the communication line, and the slave communication apparatus 150 is a communication apparatus that performs a communication operation using the clock received via the transmission line. The master communication apparatus 100 is connected to a master-side processing apparatus, such as a control apparatus or a signal processing apparatus, that outputs the data to be transmitted to the slave side to the master communication apparatus 100 and receives the data that has been received from the slave side from the master communication apparatus 100. The slave communication apparatus 150 is connected to a slave-side processing apparatus, such as a control apparatus or a signal processing apparatus, that receives the data that has been received from the master side from the slave communication apparatus 150 and outputs the data to be transmitted to the master side to the slave communication apparatus 150. As an example, the slave-side processing apparatus may be a sensor apparatus that includes at least one sensor such as a temperature sensor or pressure sensor, and the master-side processing apparatus may be a control apparatus that controls an automobile or the like according to sensor data output by the sensor apparatus.

In the present embodiment, the master communication apparatus 100 and the slave communication apparatus 150 are connected by a signal line that is a single communication line. Instead, the master communication apparatus 100 and the slave communication apparatus 150 may be connected by a plurality of such communication lines. The reference potential of each apparatus may be a common potential, and each apparatus may be connected to an independent power source or to a common power source.

The master communication apparatus 100 includes a signal generating section 110, a data recovering section 120, and a data acquiring section 130, and is connected to the communication line by a terminal DIO. When data is transmitted from the master communication apparatus 100 side to the slave communication apparatus 150 side, the signal generating section 110 generates a transmission signal by embedding the clock CLK in the data DO received from the master-side processing section, and supplies the transmission signal to the terminal DIO. The signal generating section 110 generates the transmission signal to have a first signal value when the clock CLK is a first level, a second signal value when the clock CLK is a second level and the data DO is a first data value, and a third signal value that is between the first signal value and the second signal value when the clock CLK is the second level and the data DO is a second data value.

The signal generating section 110 according to the present embodiment generates the transmission signal by embedding the high-level clock signal CLK in a data value, where the first level of the clock CLK is low level and the second level of the clock CLK is high level, which is higher than the first level. The signal generating section 110 of the present embodiment generates the transmission signal in which the second signal value is a higher level than the first signal value. In the present embodiment, an example is described in which the transmission signal has a first signal value of 0 V when the clock CLK is the first level, a second signal value of 5 V when the clock CLK is the second level and the data DO is logical H (logical high), and a third signal value of 3.3 V when the clock CLK is the second level and the data DO is logical L (logical low). Instead, the signal generating section 110 may set the first level of the clock CLK to be high level, set the second level of the clock CLK to be low level, and generate the transmission signal by embedding the clock CLK that is low level in the data value, or may set the second signal value to be lower than the first signal value. The first data value may be logical L and the second data value may be logical H.

The signal generating section 110 includes a negation element NOT1, an NMOS transistor MN1, a NAND element NAND1, a PMOS transistor MP1, a NAND element NAND2, a PMOS transistor MP2, a diode Di, a PMOS transistor MP3, and a resistor R1. The resistor R1 is a resistance element, and may be realized by the ON resistance of the PMOS transistor MP3 instead.

The negation element NOT1 and the NMOS transistor MN1 form a circuit that sets the transmission signal to have the first signal value when the clock CLK is the first level. The negation element NOT1 inverts the clock CLK, so as to output the clock CLK with the high level when the clock CLK is low level. The NMOS transistor MN1 is connected between the terminal DIO and a potential (0 V) indicating the first signal value, and sets the transmission signal to the first signal value by conducting between the terminal DIO and the potential of the first signal value in response to the output of the negation element NOT1 becoming high level.

The NAND element NAND1 and the PMOS transistor MP1 form a circuit that sets the transmission signal to the second signal value when the clock CLK is the second level and the data DO has the first data value. The NAND element NAND1 calculates the negative AND (NAND) of the data enable DE indicating that the data DO is active, the data DO, and the clock CLK. In this way, the NAND element NAND1 outputs a signal that is low level if the data DO is active (data enable DE is logical H), the data DO is the first data value (logical H), and the clock CLK is high level, and high level in all other cases. The PMOS transistor MP1 is connected between a potential (5 V) indicating the second signal value and the terminal DIO, and sets the transmission signal to the second signal value by conducting between the potential of the second signal value and the terminal DIO, in response to the output of the NAND element NAND1 becoming low level.

The NAND element NAND2, the PMOS transistor MP2, and the diode Di form a circuit that sets the transmission signal to the third signal value when the clock CLK is the first level and the data DO is the second data value. The NAND element NAND2 calculates the negative AND of the data enable DE, the logical negation of the data DO, and the clock CLK. In this way, the NAND element NAND2 outputs a signal that is low level if the data output from the master side is enabled, the data DO is the second data value (logical L), and the clock CLK is high level, and high level in all other cases. The PMOS transistor MP2 and the diode Di are connected in series, in the stated order, between the potential (3.3 V) indicating the third signal value and the terminal DIO. The PMOS transistor MP2 enters a conductive state in response to the output of the NAND element NAND2 becoming low level, and raises the potential of the terminal DIO up to the potential of the third signal value.

The PMOS transistor MP3 and the resistor R1 form a circuit that pulls the transmission signal up to the third signal value if the data DO output from the master communication apparatus 100 side is inactive, i.e. if the data DO is not output from the master communication apparatus 100 side. The PMOS transistor MP3 and the resistor R1 are connected in series between the potential (3.3 V) indicating the third signal value and the anode of the diode Di. If the data enable DE is logical L, the PMOS transistor MP3 enters a conductive state and pulls the transmission signal up to the third signal value. In this way, if the data enable DE is logical L, the transmission signal becomes the first signal value if the clock CLK is the first level and is pulled up to the third signal value if the clock CLK is the second level. When the slave communication apparatus 150 transmits the data to the master communication apparatus 100, the slave communication apparatus 150 drives the transmission signal to have second signal value according to the data value when the clock CLK is the second level.

The data recovering section 120 compares the transmission signal received from the slave communication apparatus 150 via the terminal DIO to a data threshold value, recovers the data according to the comparison result, and outputs the recovered data (recovered data RDI). The data recovering section 120 includes a voltage source REF that outputs a voltage corresponding to the data threshold value and a comparator CMP1 that compares the transmission signal to the data threshold value and outputs a value corresponding to the comparison result. Here, while transmitting the data from the slave side, the slave communication apparatus 150 drives the terminal OW to have the second signal value (5 V) if the data ICDE on the slave side is logical H and keeps the terminal OW at the third signal value (3.3 V) with the clock that is the second level embedded therein if the data ICDE is logical L, while the clock that is the second level (logical H) is embedded the transmission signal. Therefore, the voltage source REF outputs a voltage between the second signal value and the third signal value, as the voltage of the data threshold value. The comparator CMP1 outputs the recovered data RDI that is logical H when the value of the transmission signal is higher than the data threshold value and is logical L when the value of the transmission signal is less than or equal to the data threshold value.

The data acquiring section 130 acquires the recovered data RDI from the data recovering section 120, at a timing corresponding to the clock CLK. The data acquiring section 130 includes a flip-flop FF1 that acquires the recovered data RDI in response to the clock CLK having transitioned from the second level (logical H) to the first level (logical L). The flip-flop FF1 samples the recovered data RDI at the timing at which the transition of the clock CLK from the second level to the first level is detected. The flip-flop FF1 outputs the acquired data RDI to the master-side processing apparatus, as the data DI.

The slave communication apparatus 150 includes a clock recovering section 160, a data recovering section 170, a data acquiring section 180, a signal generating section 190, and a resistor R2, and is connected to the communication line by the terminal OW. The clock recovering section 160 recovers the clock from the transmission signal received via the terminal OW, and outputs the recovered clock (recovered clock ICCLK). The clock recovering section 160 may include a buffer BUF1 that outputs a value corresponding to the result of a comparison between the transmission signal and a clock threshold value. The buffer BUF1 outputs logical H when the value of the transmission signal is higher than the clock threshold value, and outputs logical L when the value of the transmission signal is less than or equal to the clock threshold value. The transmission signal in which the data is not embedded includes a clock that transitions between the first signal value (0 V) and the third signal value (3.3 V), and therefore this clock threshold value is a value between the first signal value and the third signal value.

The data recovering section 170 recovers the data according to the result of the comparison between the transmission signal received from the master communication apparatus 100 via the terminal OW and the data threshold value, and outputs the recovered data (recovered data RDI). The data recovering section 170 includes a setting value output circuit 172 and a data recovery circuit 174.

The setting value output circuit 172 sets the data threshold value. In the present embodiment, the setting value output circuit 172 sets the data threshold value to be a first setting value REF1 between the second signal value (5 V) and the third signal value (3.3 V) in response to the recovered data RDI having the second data value (logical L), and sets the data threshold value to be a second setting value REF2 between the first signal value (0 V) and the third signal value (3.3 V) in response to the recovered data RDI having the first data value (logical H). In this way, the setting value output circuit 172 can set the data threshold value to be higher than the third signal value (3.3 V) when the transmission signal is less than or equal to the data threshold value, and identify logical H (second signal value) and logical L (third signal value) of the data included in the transmission signal. Furthermore, when the transmission signal exceeds the data threshold value, i.e. after the data included in the transmission signal has been identified as being logical H, the setting value output circuit 172 sets the data threshold value to be less than the third signal value (3.3 V) to delay the change of the recovered data RDI. The setting value output circuit 172 may set the data threshold value to be lower than the clock threshold value to delay the falling of the recovered data RDI relative to the falling of the clock signal.

The setting value output circuit 172 includes a voltage source REF1 that outputs a voltage corresponding to the first setting value REF1, a voltage source REF2 that outputs a voltage corresponding to the second setting value REF2, and a switch SW1 that connects the voltage source REF1 to the data recovery circuit 174 in response to the recovered data RDI received from the data recovery circuit 174 being the second data value (logical L) and connects the voltage source REF2 to the data recovery circuit 174 in response to the recovered data RDI having the first data value (logical H).

The data recovery circuit 174 recovers the data according to the result of the comparison of the transmission signal to the data threshold value output by the setting value output circuit 172, and outputs the recovered data RDI. The data recovery circuit 174 includes a comparator CMP2 that compares the recovered data RDI to the data threshold value from the setting value output circuit 172 and outputs a value corresponding to the comparison result.

The data acquiring section 180 acquires the recovered data RDI from the data recovering section 170, at a timing corresponding to the recovered clock ICCLK. In the present embodiment, the data acquiring section 180 acquires the recovered data RDI in response to the recovered clock ICCLK having transitioned from the second level (logical H) to the first level (logical L).

The data acquiring section 180 includes a delay circuit D1 and a flip-flop FF2. The delay circuit D1 is an example of a delaying section, and delays the recovered data RDI. The flip-flop FF2 is an example of a sampling section, and samples the recovered data RDI delayed by the delay circuit D1, at a timing at which the transition of the recovered clock ICCLK from the second level to the first level is detected. The flip-flop FF2 outputs the acquired recovered data RDI to the slave-side processing apparatus, as the data ICDI.

The signal generating section 190 receives the data ICDH and the data enable ICDE from the slave-side processing apparatus, and transmits the data from the slave communication apparatus 150 to the master communication apparatus 100. The signal generating section 190 includes a NAND element NAND3 and a PMOS transistor MP4.

The NAND element calculates the negative AND of the recovered clock that has been recovered by the clock recovering section 160 being the second level, the data ICDH being logical H, and the data enable ICDE being logical H. In this way, the NAND element NAND3 outputs a signal that is low level if the data ICDH is logical H, the data enable ICDE indicating whether data output from the slave side is allowed is logical H, and the recovered clock ICCLK is high level, and is high level in all other cases.

The PMOS transistor MP4 is connected between the second signal value (5 V) and the terminal OW. The PMOS transistor MP4 enters a conductive state in response to the output of the NAND element NAND3 becoming low level, and raises the potential of the terminal OW up to the second signal value (5 V). In other words, in response to the recovered clock becoming the second level (logical H) while the data output from the slave side is enabled, the signal generating section 190 drives the terminal OW to be the second signal value (5 V) if the data ICDH is logical H and leaves the terminal OW at the third signal value (3.3 V) if the data ICDH is logical L. In this way, the signal generating section 190 can embed the clock from the master communication apparatus 100 side in the data from the slave communication apparatus 150 side. The master-side processing apparatus and the slave-side processing apparatus perform arbitration so as not to enable data at the same time, based on a predetermined communication protocol.

The resistor R2 is connected between the terminal OW and the potential (0 V) indicating the first signal value, and pulls the terminal OW down to a ground potential.

Figure 2:
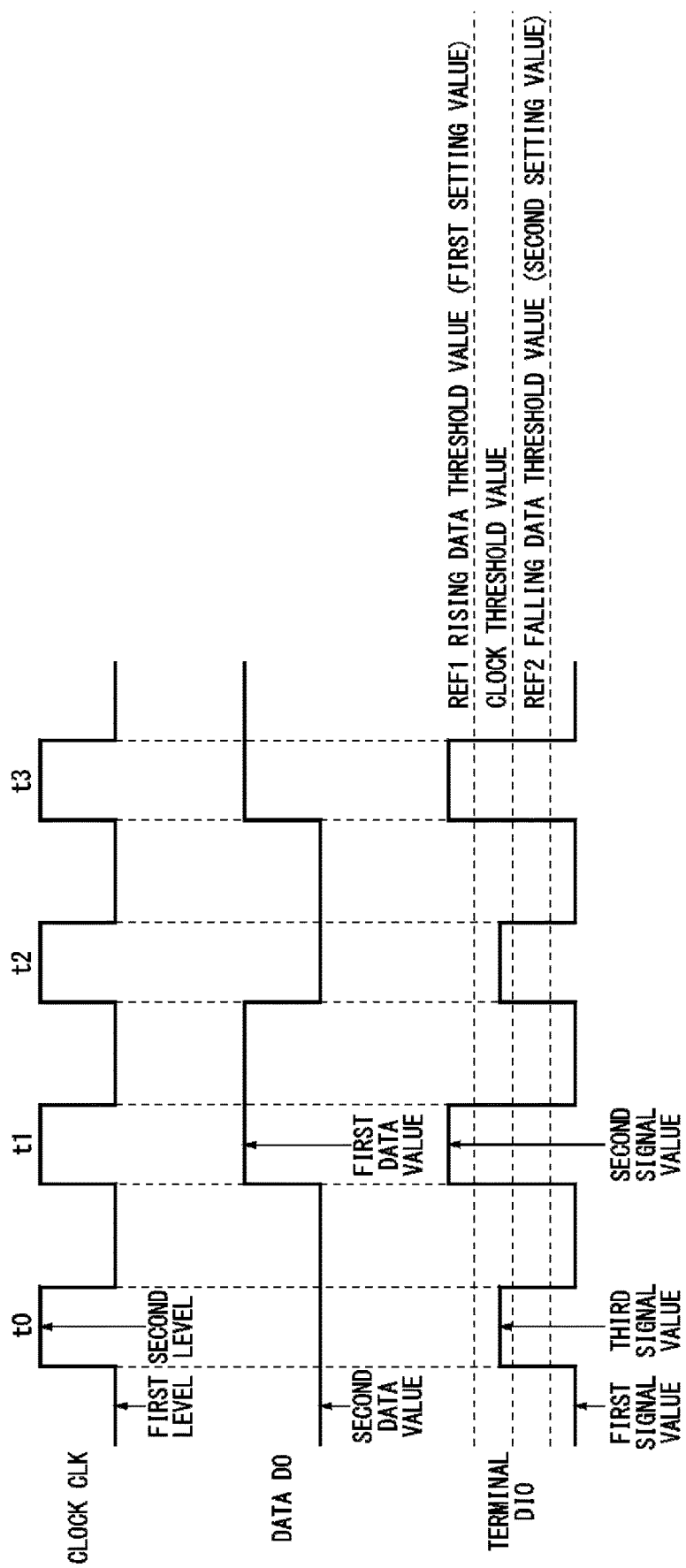
FIG. 2 shows an example of a transmission signal transmitted by the master communication apparatus of the communication system 10 according to the present embodiment.

FIG. 2 shows an example of a transmission signal transmitted by the master communication apparatus of the communication system 10 according to the present embodiment. The present drawing shows the passage of time along the horizontal axis, and shows the respective waveforms of the clock CLK and the data DO received by the master communication apparatus 100 from the master-side processing apparatus and the transmission signal output by the master communication apparatus 100 from the terminal DIO along the vertical direction. In the present drawing, a case is shown in which the master communication apparatus 100 receives a data enable DE that is logical H, i.e. a case where data is transmitted from the master communication apparatus 100 to the slave communication apparatus 150.

Immediately before the timing t0, the master communication apparatus 100 receives the clock that is the first level (logical L). In response to this, the master communication apparatus 100 outputs the transmission signal that has the first signal value (0 V) from the terminal DIO.

At the timing t0, the master communication apparatus 100 receives the clock that is the second level (logical H) and the data DO that has the second data value (logical L). In response to this, the master communication apparatus 100 outputs the transmission signal having the third signal value (3.3 V) from the terminal DIO. After this, when the clock changes from the second level to the first level (logical L), the master communication apparatus 100 outputs the transmission signal having the first signal value from the terminal DIO.

At the timing t1, the master communication apparatus 100 receives the clock that is the second level and the data DO that has the first data value (logical H). In response to this, the master communication apparatus 100 outputs the transmission signal having the second signal value (5 V) from the terminal DIO. After this, when the clock changes from the second level to the first level (logical L), the master communication apparatus 100 outputs the transmission signal having the first signal value from the terminal DIO.

At the timings t2 and t3, the master communication apparatus 100 operates in the same manner as at the timings t0 and t1.

Figure 3:
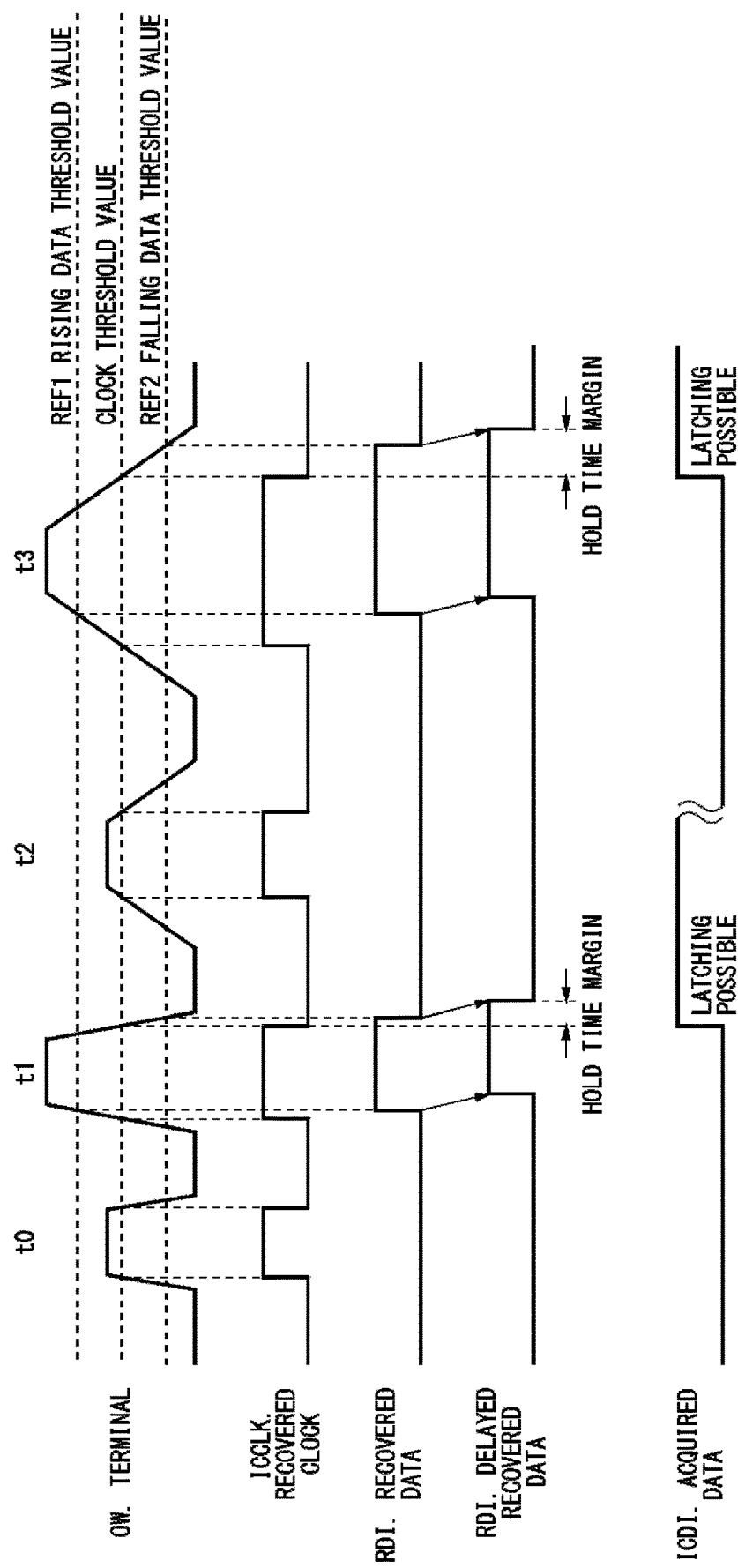
FIG. 3 shows an example of an operation timing chart of the communication system 10 according to the present embodiment.

FIG. 3 shows an example of an operation timing chart of the communication system 10 according to the present embodiment. The present drawing shows the passage of time along the horizontal axis, and shows the respective waveforms of the terminal OW of the slave communication apparatus 150, the recovered clock ICCLK, the recovered data RDI, the delayed recovered data RDI, and the data ICDI acquired by the data acquiring section 180, in a case where the master communication apparatus 100 transmits the transmission signal having the clock embedded in the data to the slave communication apparatus 150 (i.e. a case where the data enable DE on the master communication apparatus 100 side is logical H and the data enable on the slave communication apparatus 150 side is logical L), along the vertical direction. The present drawing shows the operation of the slave communication apparatus 150 in a case where the master communication apparatus 100 has output the transmission signal shown in FIG. 2 from the terminal DIO.

Before the timing t0, the slave communication apparatus 150 receives the transmission signal with the data DO that is logical L embedded therein, i.e. the transmission signal having the third signal value (3.3 V), while the clock CLK is the second level (high level). The transmission signal transitions to the first signal value (0 V) in response to the clock becoming the first level (low level).

At the timing t0, as a result of the comparison between the transmission signal and the clock threshold value (a potential higher than 0 V and lower than 3.3 V), the clock recovering section 160 outputs the recovered clock ICCLK that changes to the second level (high level) in response to the transmission signal changing from the first signal value to the third signal value and changes to the first level in response to the transmission signal changing from the third signal value to the first signal value.

While the transmission signal is the first signal value (0 V), which is less than or equal to the data threshold value, the data recovery circuit 174 outputs the recovered data RDI having the second data value (logical L). Therefore, the setting value output circuit 172 sets the first setting value REF1 (higher than 3.3 V and less than 5 V) as the data threshold value.

Since the transmission signal only rises up to the third signal value (3.3 V) at the timing t0 while the clock CLK is the second level (high level), the data recovery circuit 174 outputs the recovered data RDI having the second data value (logical L) during the cycle corresponding to the timing t0. The data acquiring section 180 delays the recovered data RDI and acquires the recovered data RDI at the timing at which the recovered clock ICCLK changes from the second level to the first level (the falling timing in the present embodiment), and outputs this acquired data as the data ICDI.

At the timing t1, the slave communication apparatus 150 receives at the terminal OW the transmission signal having the data DO that is logical H embedded therein, i.e. the transmission signal having the second signal value (5 V), while the clock CLK is the second level (high level). The transmission signal transitions to the first signal value (0 V) in response to the clock becoming the first level (low level).

As a result of the comparison between the transmission signal and the clock threshold value (a potential between 3.3 V and 0 V), the clock recovering section 160 outputs the recovered clock ICCLK that changes to the second level (high level) in response to the transmission signal changing from the first signal value to the third signal value and changes to the first level (low level) in response to the transmission signal changing from the third signal value to the first signal value.

While the transmission signal has the first signal value (0 V), the transmission signal is less than or equal to the data threshold value, and therefore the data recovery circuit 174 outputs the recovered data RDI having the second data value (logical L). Therefore, the setting value output circuit 172 sets the first setting value REF1 (a potential higher than 3.3 V and less than 5 V) as the data threshold value.

The transmission signal rises to the second signal value (5V) at the timing t1, while the clock CLK is the second level (high level). The data recovery circuit 174 sets the recovered data RDI to be logical H in response to the transmission signal exceeding the first setting value REF1 set as the data threshold value. In response to this, the setting value output circuit 172 switches the data threshold value to be the second setting value REF2 (a potential higher than 0 V and lower than 3.3 V). The data acquiring section 180 delays the recovered data RDI and acquires the recovered data RDI that is logical H at the timing at which the recovered clock ICCLK changes from the second level to the first level, and outputs this acquired data as the data ICDI.

Here, the recovered clock ICCLK and the recovered data RDI both have values that change based on the result of the comparison with the threshold value that is between the first signal value and the third signal value. By delaying the recovered data RDI using the delay circuit D1, the data acquiring section 180 can ensure a margin by setting the time from when the recovered clock ICCLK changes to when the recovered data RDI changes to be greater than or equal to the minimum hold time of the flip-flop FF2.

The clock recovering section 160 may use a value that is between the third signal value and the second setting value as the clock threshold value, as shown in present drawing. In this way, the clock threshold value becomes closer to the third signal value (3.3 V) than the second setting value REF2 is, and therefore the recovered clock ICCLK changes to the first level first and then the recovered data RDI changes, while the transmission signal transitions from the second signal value to the first signal value. Accordingly, even in a case where the through rate of the transmission signal changes due to the characteristics of the communication line being used, the slave communication apparatus 150 can ensure the minimum hold time of the flip-flop FF2.

Figure 4:
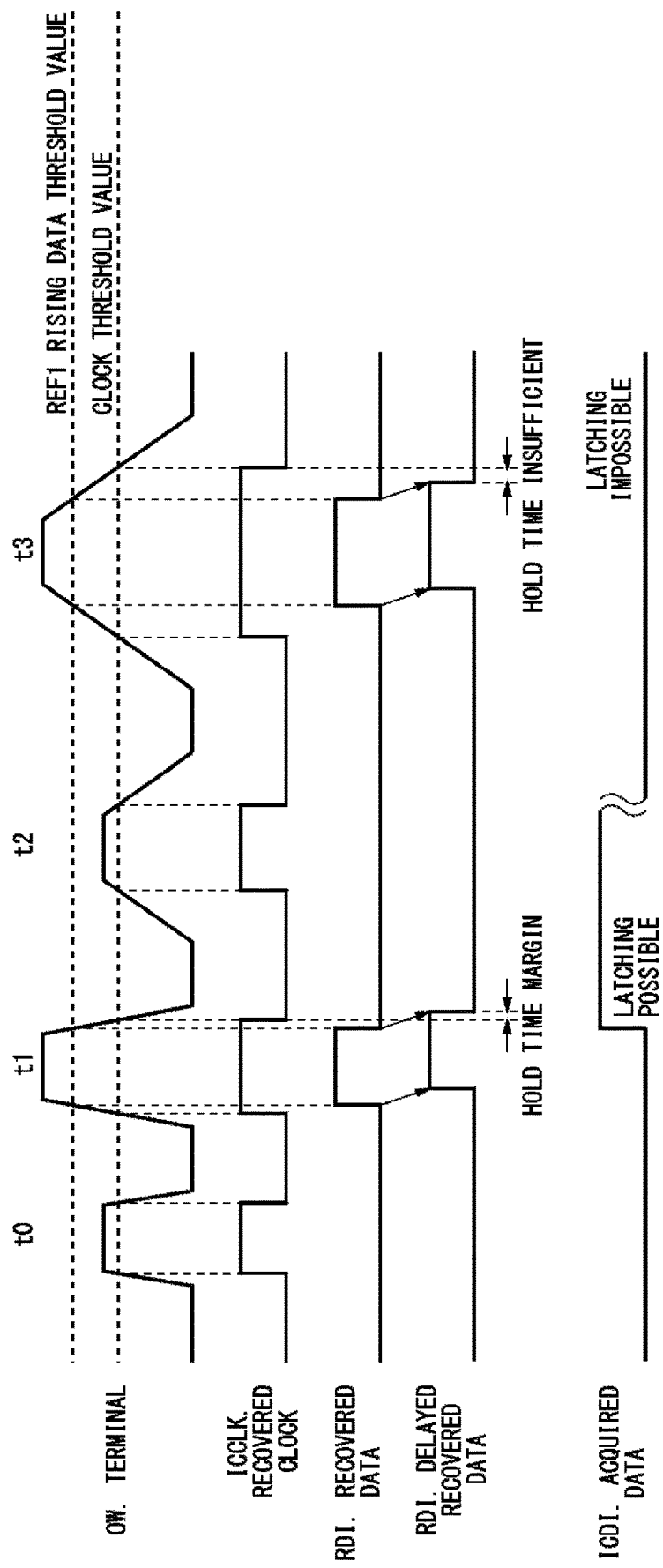
FIG. 4 shows a comparative example of an operation timing chart of the communication system 10 according to the present embodiment.

FIG. 4 shows an operation timing chart of a case where the rising/falling delay time has become larger between the timings t2 and t3 than between the timings t1 and t2, due to a change in the characteristics of the communication line. The operation at the timing t2, where the data DO has the second data value (logical L), is the same as the operation at the timing t0, and therefore a description thereof is omitted.

At the timing t3, the slave communication apparatus 150 performs basically the same operation as at the timing t1. Here, if it is assumed that the data recovering section 170 always uses the data threshold value between the second signal value and the third signal value, i.e. the data threshold value that that is the first setting value REF1 (higher than 3.3 V and less than 5 V), for example, regardless of the value of the recovered data RDI, as shown in the comparative example of FIG. 4, the recovered data RDI changes from the first data value (logical H) to the second data value (logical L) at the timing when the transmission signal changes from the second signal value (5 V) to the first setting value REF1, and then the recovered clock ICCLK changes from the second level (logical H) to the first level (logical L) at the timing when the transmission signal changes to the clock threshold value (higher than 0 V and less than 3.3 V). As shown at the timing t1 in the comparative example of FIG. 4, if the falling delay time of the transmission signal is somewhat small, it is possible to ensure the minimum hold time after the falling of the recovered clock ICCLK to when the recovered data RDI falls. However, as the falling delay time of the transmission signal become larger, the time from when the recovered data RDI changes to when the recovered clock ICCLK changes becomes longer. Therefore, as shown at the timing t3 in the comparative example of FIG. 4, even though the delay circuit D1 is used, it becomes impossible to ensure the minimum hold time of the flip-flop FF2.

According to the slave communication apparatus 150 of the present embodiment, as shown in FIG. 3, the data threshold value is set to the second setting value REF2 that is between the first signal value (0 V) and the third signal value (3.3 V) in response to the recovered data RDI having the first data value (logical H). In this way, the slave communication apparatus 150 can keep the recovered data RDI at the first data value until the transmission signal has changed from the second signal value and passed the third signal value to reach the second setting value, and can ensure a sufficient margin for the hold time even when the falling delay time of the communication line becomes large.

Furthermore, if the clock threshold value is set to be a value between the second setting value REF2 and the second signal value (3.3 V), i.e. a value that is larger than the second setting value REF2 and smaller than the second signal value, the slave communication apparatus 150 can delay the change timing of the recovered data RDI more than the change timing of the recovered clock ICCLK regardless of the magnitude of the falling delay time, and can ensure a margin for the hold time regardless of the transmission delay.

In the communication system 10 described above, the data recovering section 120 in the master communication apparatus 100 does not have a function for switching the data threshold value according to the recovered data RDI, and the data acquiring section 130 does not include a delay circuit that delays the recovered data RDI in the manner of the delay circuit in the data acquiring section 180 of the slave communication apparatus 150. Here, in the master communication apparatus 100, in a case where there is an insufficient margin from when the clock CLK changes to when the recovered data RDI changes via the negation element NOT1, the NMOS transistor MN1, and the comparator CMP1 and it is impossible to ensure the minimum hold time of the flip-flop FF1, the data recovering section 120 may be configured in the same manner as the data recovering section 170 and a delay circuit similar to the delay circuit D1 may be provided in the data acquiring section 130.

Figure 5:
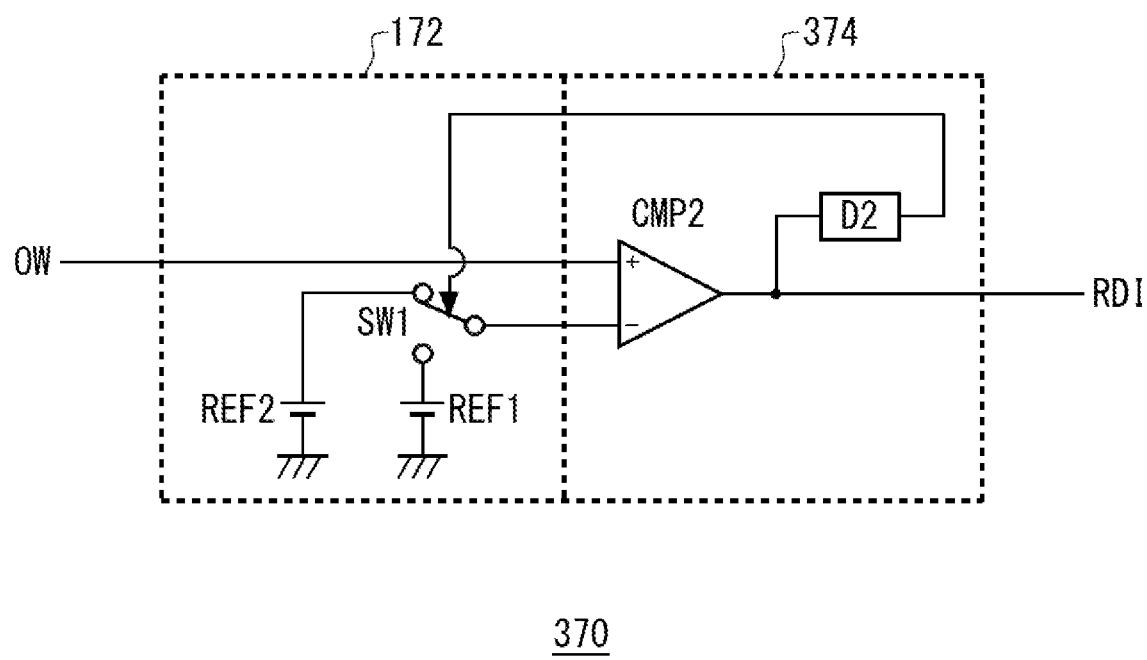
FIG. 5 shows a configuration of a data recovering section 370 according to a first modification of the present embodiment.

FIG. 5 shows a configuration of a data recovering section 370 according to a first modification of the present embodiment. The communication system 10 may use the data recovering section 370 shown in the present drawing instead of the data recovering section 170 shown in FIG. 1. In the present drawing, configurational elements that have the same reference numerals as in FIG. 1 have the same function and configuration as in FIG. 1, and the following description deals with only differing points.

The data recovering section 370 includes the setting value output circuit 172 and a data recovery circuit 374. The setting value output circuit 172 is the same as the setting value output circuit 172 shown in FIG. 1. The data recovery circuit 374 compares the transmission signal received from the master communication apparatus 100 via the terminal OW to the data threshold value output by the setting value output circuit 172, recovers the data according to the comparison result, and outputs the recovered data (recovered data RDI).

The data recovery circuit 374 includes the comparator CMP2 and a delay circuit D2. The comparator CMP2 is the same as the comparator CMP2 shown in FIG. 1. The delay circuit D2 is an example of a noise suppression circuit that suppresses noise of the recovered data RDI.

The delay circuit D2 delays the recovered data RDI output by the comparator CMP2 by a very small time, and supplies the delayed data to the setting value output circuit 172. This delay time may be set to be shorter than the time during which the clock CLK or recovered clock ICCLK is kept at the second level (high level) and longer than the time needed for the setting value output circuit 172 to switch the data threshold value.

The data recovering section 370 described above can switch which of the first setting value and the second setting value the data threshold value is to be set as, according to the data value of the recovered data RDI in which the noise is suppressed. In this way, even in a case where the data threshold value input to the comparator CMP2 at the switching time or the like of the switch SW1 in the setting value output circuit 172 becomes unstable, for example, and noise occurs in the recovered data RDI, the data recovering section 370 can stabilize the recovered data RDI used by the setting value output circuit 172 for selecting the data threshold value, to stabilize the data threshold value. Furthermore, even in a case where the transmission signal instantaneously exceeds the first setting value REF1 due to noise during the time period when the recovered clock ICCLK is the second level (high level) at the timing t0 of FIG. 3, for example, the data recovering section 370 can keep the output of the delay circuit D2 at the second data value (logical L) and prevent the data threshold value from switching to the second setting value REF2, which would cause the recovered data RDI to be misidentified as having the first data value (logical H).

Various other circuits can be used as the noise suppression circuit that suppresses noise of the recovered data RDI. For example, a noise suppression circuit realized by an integration circuit or the like may be provided in the data recovering section 170 shown in FIG. 1 in at least one of the wire transmitting the selected data threshold value between the switch SW1 and the comparator CMP2 and the wire transmitting the recovered data RDI in the switch SW1 from the comparator CMP2, a noise suppression circuit or the like that cancels out instantaneous noise using a digital delay circuit may be provided in the wire transmitting the recovered data RDI in the switch SW1 from the comparator CMP2, or the comparator CMP2 may be a hysteresis comparator.

Figure 6:
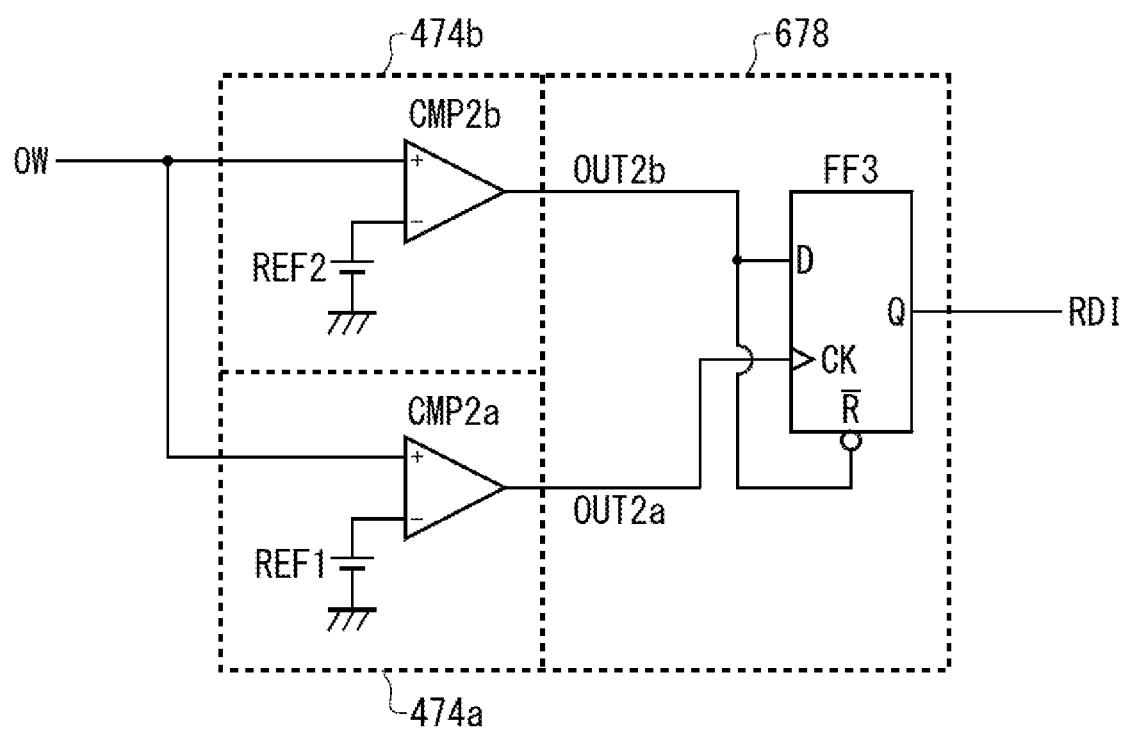
FIG. 6 shows a configuration of a data recovering section 670 according to a second modification of the present embodiment.

FIG. 6 shows a configuration of a data recovering section 670 according to a second modification of the present embodiment. The communication system 10 may use the data recovering section 670 shown in the present drawing instead of the data recovering section 170 shown in FIG. 1.

The data recovering section 670 includes a plurality of data recovery circuits 474a to 474b (also referred to as the "data recovery circuits 474") and a switching circuit 678. Each of the plurality of data recovery circuits 474 recovers the data according to the results of comparisons between the transmission signal and respectively different data threshold values, and outputs the recovered data. In the example of the present drawing, the data recovery circuit 474a recovers the data according to the result of the comparison between the transmission signal and the first setting value REF1, and the data recovery circuit 474b recovers the data according to the result of the comparison between the transmission signal and the second setting value REF2.

The switching circuit 678 changes the recovered data being output from the second data value (logical L) to the first data value (logical H) in response to the transmission signal exceeding the first setting value REF1, and changes the recovered data being output from first data value (logical H) to the second data value (logical L) in response to the transmission signal becoming less than or equal to the second setting value REF2. In the present embodiment, the switching circuit 678 includes a flip-flop FF3. The flip-flop FF3 is a flip-flop that includes a clock terminal CLK and an inverse reset terminal /R. The flip-flop FF3 has the clock terminal connected to an output OUT2a of the data recovery circuit 474a, has the inverse reset terminal and a data terminal D connected to an output OUT2b of the data recovery circuit 474b, and outputs the recovered data RDI from the output terminal Q.

If the transmission signal input from the terminal OW has the first signal value (0 V), the output OUT2a of the data recovery circuit 474a and the output OUT2b of the data recovery circuit 474b are both logical L. In response to logical L being input to the inverse reset terminal, the flip-flop FF3 resets the internal state thereof and outputs the recovered data RDI having the second data value (logical L). When the transmission signal rises to exceed the second setting value REF2, the output OUT2b becomes logical H, and the flip-flop FF3 receives logical H at the data terminal and receives logical H (no reset) at the reset terminal. At this stage, the flip-flop FF3 maintains the state of outputting the recovered data RDI having the second data value (logical L).

When the transmission signal rises further and exceeds the first setting value REF1, the output OUT2a also changes to logical H. In accordance with this, the flip-flop FF3 receives the clock that rises from logical L to logical H at the clock terminal, and latches the value of the data terminal in response to this. In this way, the flip-flop FF3 changes the recovered data RDI to have the first data value (logical H).

After this, when the transmission signal falls and becomes less than or equal to the first setting value REF1, the output OUT2a becomes logical L. In this case, the flip-flop FF3 keeps the recovered data RDI at the first data value (logical H). When the transmission signal falls further and becomes less than or equal to the second setting value REF2, the output OUT2b also becomes logical L. In accordance with this, the flip-flop FF3 receives logical L (reset) at the inverse reset terminal, and resets the internal state thereof to change the recovered data RDI to have the second data value (logical L).

Instead of the above, the switching circuit 678 may input a signal fixed at logical H to the data terminal.

Figure 7:
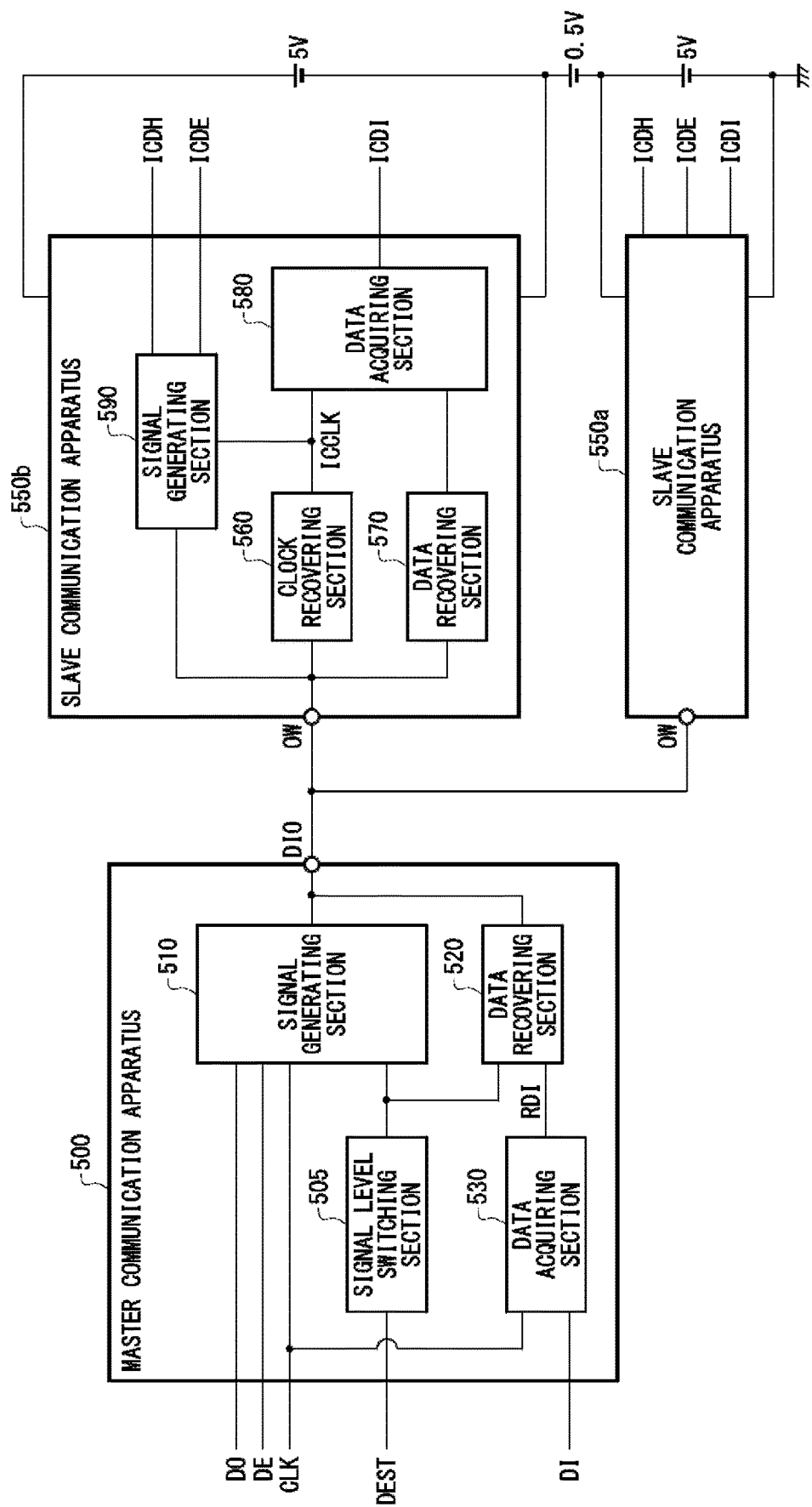
FIG. 7 shows a configuration of a communication system 50 according to a third modification of the present embodiment.

FIG. 7 shows a configuration of a communication system 50 according to a third modification of the present embodiment. The communication system 50 includes a master communication apparatus 500 and a plurality of slave communication apparatuses 550a to 550b (also referred to as the "slave communication apparatuses 550") connected by a communication line, and transmits a transmission signal with a clock and data embedded therein between the master communication apparatus 500 and each slave communication apparatus 550 via the communication line. The communication system 50 is a modification of the communication system 10, and therefore the following description includes only differing points.

The master communication apparatus 500 is a communication apparatus on the master side that transmits the clock to each slave communication apparatus 550 via the communication line, and each slave communication apparatus 550 is a communication apparatus on the slave side that performs a communication operation using the clock received from the master communication apparatus 500 via the communication line. The master communication apparatus 500 designates the slave communication apparatus 550 that is the destination by switching the value (second signal value) of the transmission signal in which the data having the first data value (logical H) with the clock having the second level embedded therein and the value (third signal value) of the transmission signal in which the data having the second data value (logical L) has the clock having the second level embedded therein, according to the slave communication apparatus 550 that is to be the destination. In this way, the communication system 50 can realize bidirectional communication between the master communication apparatus 500 and each of the plurality of slave communication apparatuses 550, using a single communication line.

The master communication apparatus 500 includes a signal level switching section 505, a signal generating section 510, a data recovering section 520, and a data acquiring section 530. The signal level switching section 505 receives the destination information DEST indicating the destination of the data from the master-side processing apparatus, and switches the signal levels of the second signal value and the third signal value according to the slave communication apparatus 550 that is the destination of the data. As an example, the signal level switching section 505 sets the voltage of the second signal value and the voltage of third signal value according to the destination information DEST, and supplies these voltages to the signal generating section 510. Furthermore, the signal level switching section 505 supplies the data recovering section 520 with the voltage of the data threshold value to be used by the data recovering section 520 in order to identify the value of the data received from the slave communication apparatus 550, according to the destination information DEST.

The signal generating section 510 receives the clock CLK, the data DO, and the data enable DE from the master-side processing apparatus, and generates the transmission signal by embedding the clock CLK in the data DO. When transmitting the data from the master side, the signal generating section 510 embeds the data in the clock to generate the transmission signal that has the first signal value when the clock is the first level, the second signal value when the clock is the second level and the data has the first data value, and the third signal value that is between the first signal value and the second signal value when the clock is the second level and the data has the second data value. Here, the signal generating section 510 generates the transmission signal using the second signal value and the third signal value supplied from the signal level switching section 505. The signal generating section 510 may be configured to use the second signal value and the third signal value that differ according to the destination information DEST supplied from the signal level switching section 505, instead of the second signal value (5 V) and the third signal value (3.3 V) used in the signal generating section 110 shown in FIG. 1.

The data recovering section 520 recovers the data according to the result of a comparison between the transmission signal received from the slave communication apparatus 550 via the terminal DIO and the data threshold value, and outputs the recovered data (recovered data RDI). The data recovering section 520 may be configured to recover the data using the data threshold value corresponding to the destination information DEST supplied from the signal level switching section 505, in the data recovering section 120 shown in FIG. 1.

The data acquiring section 530 acquires the recovered data RDI from the data recovering section 520, at a timing corresponding to the clock CLK. The data acquiring section 530 may have the same function and configuration as the data acquiring section 130 shown in FIG. 1.

Each of the plurality of slave communication apparatuses 550 is assigned a second signal value and a third signal value that differ from each other, and these signal values are used separately by the master communication apparatus 500 according to the slave communication apparatus 550 that is the destination. In the present embodiment, the plurality of slave communication apparatuses 550 are respectively assigned signal level ranges that do not overlap with each other. In order to realize this, identical apparatuses are used as the plurality of slave communication apparatuses 550, and as shown in the present drawing, the power source potential and ground potential of the respective slave communication apparatuses 550 may be caused to be different, such that each slave communication apparatus 550 operates in a different range of signal levels. In the example of the present drawing, a range of 0 V to 5 V is assigned to the slave communication apparatus 550a, a range of 5.5 V to 10.5 V is assigned to the slave communication apparatus 550b, and a margin of 0.5 V (between 5 V to 5.5 V) is provided between these ranges. Therefore, in the example of the present drawing, the slave communication apparatus 550a has a ground potential set to 0 V and a power source potential set to 5 V, and the slave communication apparatus 550b has a ground potential set to 5.5 V and a power source potential set to 10.5 V.

Each slave communication apparatus 550 includes a clock recovering section 560, a data recovering section 570, a data acquiring section 580, and a signal generating section 590. The clock recovering section 560 recovers the clock from the transmission signal received via the terminal OW, and outputs the recovered clock ICCLK. The clock recovering section 560 may have the same function and configuration as the clock recovering section 160 shown in FIG. 1.

The data recovering section 570 recovers the data according to the result of the comparison between the transmission signal received via the terminal OW and the data threshold value, and outputs the recovered data RDI. The data recovering section 570 uses the first setting value REF1 and the second setting value REF2 corresponding to slave identification information (slave ID) in the communication system 50. Furthermore, on a condition that the signal level of the transmission signal is within a range of values corresponding to the slave identification information, the data recovering section 570 judges that this data is destined for the slave communication apparatus 550, and if the signal level is outside this range, the data recovering section 570 judges that this data is not destined for the slave communication apparatus 550. The remaining portions of the data recovering section 570 may have the same function and configuration as the data recovering section 170 shown in FIG. 1. In this way, the data recovering section 570 of each slave communication apparatus 550 can recover the data destined for this slave communication apparatus 550, embedded in the transmission signal including the second signal value and the third signal value corresponding to this slave communication apparatus 550.

The data acquiring section 580 acquires the recovered data RDI from the data recovering section 570, at a timing corresponding to the recovered clock ICCLK. The data acquiring section 580 may have the same function and configuration as the data acquiring section 180 shown in FIG. 1.

The signal generating section 590 receives the data ICDH and the data enable ICDE from the slave-side processing apparatus, and transmits the data from the slave communication apparatus 550 to the master communication apparatus 500. The signal generating section 590 may be configured to use the second signal value corresponding to each slave communication apparatus 550, instead of the second signal value (5V) in the signal generating section 190 shown in FIG. 1.

Figure 8:
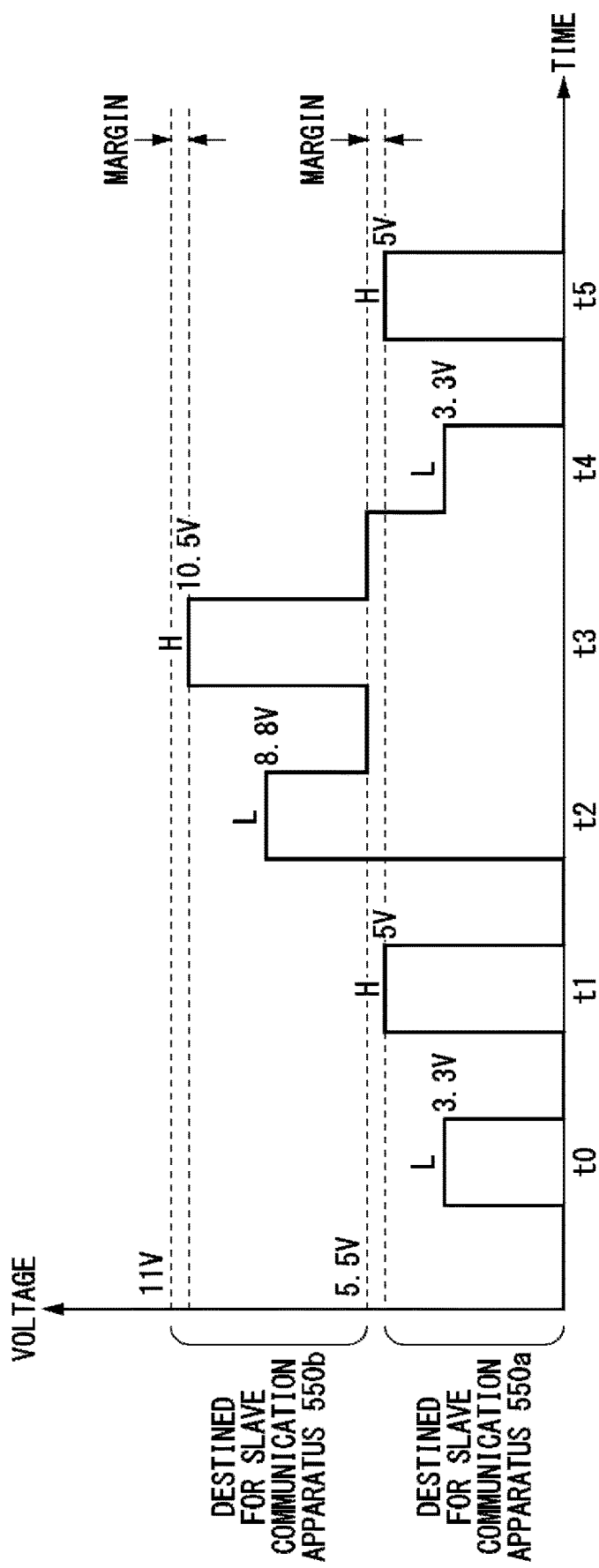
FIG. 8 shows an example of a transmission signal transmitted by the master communication apparatus 500 according to a third embodiment of the present embodiment.

FIG. 8 shows an example of a transmission signal transmitted by the master communication apparatus 500 according to a third embodiment of the present embodiment. The present drawing shows the passage of time along the horizontal axis, and shows the signal level (voltage) of the transmission signal along the vertical axis. As shown in relation to FIG. 7, in the present modification, each of the plurality of slave communication apparatuses 550 is assigned a second signal value and a third signal value that differ from the signal values of the other. In the example of the present drawing, the plurality of slave communication apparatuses 550 are respectively assigned signal level ranges that do not overlap with each other. Therefore, the signal level switching section 505 switches the signal levels of the second signal value and the third signal value to be signal levels included in the range assigned to the slave communication apparatus 550 that is destination of the data. As shown in FIG. 8, a predetermined margin (0.5 V in the example of the present drawing) may be provided between the signal level ranges assigned to the respective slave communication apparatuses 550.

At the timings t0 and t1, the master communication apparatus 500 receives the destination information DEST designating the slave communication apparatus 550a as the destination, from the master-side processing apparatus. Therefore, the signal level switching section 505 in the master communication apparatus 500 sets the second signal value (5 V) and the third signal value (3.3 V) corresponding to the slave communication apparatus 550a, and supplies these signal values to the signal generating section 510. Furthermore, the signal level switching section 505 supplies the data recovering section 520 with the data threshold value (a value higher than 3.3 V and lower than 5 V) for the data recovering section 520 corresponding to the slave communication apparatus 550a. In this way, at the timings t0 and t1, the master communication apparatus 500 generates and outputs the transmission signal using the second signal value and the third signal value included in the range assigned to the slave communication apparatus 550a.

The clock recovering section 560 in the slave communication apparatus 550a recovers the clock according to the result of the comparison between the transmission signal and the clock threshold value (a value higher than 0 V and lower than 3.3 V). Since the data (logical L) with the clock that is the second level (high level) at the timing t0 embedded therein and the data (logical H) with the clock that is the second level at the timing t1 embedded therein are within the range of values (e.g. greater than or equal to 0 V and less than 5.5 V) corresponding to the slave communication apparatus 550a, the data recovering section 570 in the slave communication apparatus 550a judges that these pieces of data are destined for the slave communication apparatus 550a.

The data recovering section 570 in the slave communication apparatus 550a uses a value between the second signal value (5 V) and the third signal value (3.3 V) for the slave communication apparatus 550a as the first setting value to be used as the data threshold value, and uses a value between the first signal value (0 V) and the third signal value (3.3 V) to be used by the slave communication apparatus 550a as the second setting value.

On the other hand, since the pieces of data with the clock embedded therein at the timings t0 and t1 are not within the range of values (e.g. greater than or equal to 5.5 V and less than 11 V) corresponding to the slave communication apparatus 550b, the data recovering section 570 in the slave communication apparatus 550b judges that these pieces of data are not destined for the slave communication apparatus 550b, and sets these pieces of data to not be used in the slave communication apparatus 550b.

At the timings t2 and t3, the master communication apparatus 500 receives the destination information DEST designating the slave communication apparatus 550b as the destination, from the master-side processing apparatus. Therefore, the signal level switching section 505 in the master communication apparatus 500 sets the second signal value (10.5 V) and the third signal value (8.8 V) corresponding to the slave communication apparatus 550b, and supplies these signal values to the signal generating section 510. Furthermore, the signal level switching section 505 supplies the data recovering section 520 with the data threshold value (a value higher than 8.8 V and lower than 10.5 V) for the data recovering section 520 corresponding to the slave communication apparatus 550b. In this way, at the timings t2 and t3, the master communication apparatus 500 generates and outputs the transmission signal using the second signal value and the third signal value included in the range assigned to the slave communication apparatus 550b.

In the example of the present drawing, the signal level switching section 505 further includes a function for switching the signal level of the first signal value to a signal level included in the range assigned to the slave communication apparatus 550 that is the destination of the data. Therefore, while the slave communication apparatus 550b is the destination, the master communication apparatus 500 sets the first signal value, the second signal value, and the third signal value to be within the signal level range assigned to the slave communication apparatus 550b.

The data recovering section 570 in the slave communication apparatus 550b uses a value between the second signal value (10.5 V) and the third signal value (8.8 V) for the slave communication apparatus 550b as the first setting value to be used as the data threshold value, and uses a value between the first signal value (5.5 V) and the third signal value (8.8 V) to be used by the slave communication apparatus 550b as the second setting value.

The clock recovering section 560 in the slave communication apparatus 550b recovers the clock according to the result of a comparison between the transmission signal and the clock threshold value (a value higher than 5.5 V and lower than 8.8 V) for the slave communication apparatus 550b. Since the data (logical L) with the clock that is the second level (high level) at the timing t2 embedded therein and the data (logical H) with the clock that is the second level at the timing t3 embedded therein are within the range of values (e.g. greater than or equal to 5.5 V and less than 10.5 V) corresponding to the slave communication apparatus 550b, the data recovering section 570 in the slave communication apparatus 550b judges that these pieces of data are destined for the slave communication apparatus 550b.

On the other hand, since the pieces of data with the clock embedded therein at the timings t2 and t3 are not within the range of values (e.g. greater than or equal to 0 V and less than 5.5 V) corresponding to the slave communication apparatus 550a, the data recovering section 570 in the slave communication apparatus 550a judges that these pieces of data are not destined for the slave communication apparatus 550a, and sets these pieces of data to not be used in the slave communication apparatus 550a.

According to the communication system 50 of the present modification, the master communication apparatus 500 can designate the slave communication apparatus 550 that is to be the destination by switching the signal level of the transmission signal, and therefore there is no need to include destination information in the data of the transmission signal. Furthermore, if the signal level of the first signal value is also within the range assigned to the slave communication apparatus 550 that is the destination, as in the example of the present drawing, it is possible to limit the amplitude of the signal line when using a communication method designating the same destination continuously during one cycle, thereby reducing the power consumption.

Instead of the above, the first signal value may be a fixed signal level that does not depend on the slave communication apparatus 550 that is the destination of the data. In this way, the signal generating section 510 can be configured to connect the terminal DIO to a reference potential such as the ground potential, for example, while the clock is the first level (low level), regardless of the destination. Furthermore, all of the slave communication apparatuses 550 can use, in common, values between the value closest to the first signal value and the first signal value (e.g. a value between 3.3 V and 0 V), among the third signal values used respectively by all of the slave communication apparatuses 550, as the clock threshold value and the second setting value.

In the above, an example is shown in which the communication system 10 includes two slave communication apparatuses 550. Instead of this, the communication system 10 may include three or more slave communication apparatuses 550.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A master communication apparatus comprising:
   a signal generating section that generates a transmission signal by embedding a clock in data, the transmission signal having a first signal value when the clock is a first level, a second signal value when the clock is a second level and the data has a first data value, and a third signal value between the first signal value and the second signal value when the clock is the second level and the data has a second data value; and
   a signal level switching section that switches signal levels of the second signal value and the third signal value according to a slave communication apparatus that is a destination of the data.

2. The master communication apparatus according to claim 1, wherein
   a plurality of slave communication apparatuses, where each slave communication apparatus is the slave communication apparatus, are respectively assigned ranges of signal levels that do not overlap with each other, and
   the signal level switching section switches the signal levels of the second signal value and the third signal value to be signal levels included within the range assigned to the slave communication apparatus that is a destination of the data.

3. The master communication apparatus according to claim 2, wherein
   the signal level switching section switches the signal level of the first signal value to a signal level included in the range assigned to the slave communication apparatus that is a destination of the data.

4. The master communication apparatus according to claim 2, wherein
   the first signal value is a fixed signal level that does not depend on the slave communication apparatus that is a destination of the data.

* * * * *